United States Patent
Reichert

(12) United States Patent (10) Patent No.: US 6,553,529 B1
(45) Date of Patent: Apr. 22, 2003

(54) LOW COST TIMING SYSTEM FOR HIGHLY ACCURATE MULTI-MODAL SEMICONDUCTOR TESTING

(75) Inventor: Peter Reichert, Thousand Oaks, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/360,215

(22) Filed: Jul. 23, 1999

(51) Int. Cl.[7] .............................................. G01R 31/28
(52) U.S. Cl. ...................................................... 714/738
(58) Field of Search ................................ 714/738, 724, 714/742, FOR 101; 324/765, 73.1, 158.1; 327/105; 365/201

(56) References Cited

U.S. PATENT DOCUMENTS

| | | | |
|---|---|---|---|
| 4,931,723 A | * | 6/1990 | Jeffrey et al. ............... 371/22.3 |
| 5,321,702 A | * | 6/1994 | Brown et al. .................. 371/27 |
| 5,544,175 A | | 8/1996 | Posse ......................... 371/25.1 |
| 5,566,188 A | | 10/1996 | Robbins et al. ................ 371/27 |
| 5,570,383 A | | 10/1996 | Brown et al. .................. 371/62 |
| 5,581,177 A | | 12/1996 | Hussey et al. ............. 324/158.1 |
| 5,654,971 A | | 8/1997 | Heitele et al. ................. 371/24 |
| 5,689,515 A | | 11/1997 | Panis ........................ 371/22.1 |
| RE36,063 E | | 1/1999 | Conner ........................ 395/550 |
| 5,889,936 A | * | 3/1999 | Chan ...................... 395/183.15 |
| 5,917,834 A | * | 6/1999 | Arkin ........................ 371/22.1 |
| 6,032,282 A | * | 2/2000 | Masuda et al. ............. 714/744 |
| 6,092,225 A | * | 7/2000 | Gruodis et al. ............. 714/724 |
| 6,115,303 A | * | 9/2000 | Fister .......................... 365/201 |
| 6,275,057 B1 | * | 8/2001 | Takizawa .................... 324/765 |

OTHER PUBLICATIONS

Armstrong, A.: "Timing Innovations Serve Logic and Mixed–Signal ATE"; Test and Measurement World; US Cahners Publishing, Denver; vol. 18, No. 11, Oct. 1, 1998, pp. 47–48, 50, 52, 54, XP000788714; ISSN: 0744–1657; p. 50, right–hand column, line 1—p. 51, right–hand column, line 30; figures 4–6.

* cited by examiner

*Primary Examiner*—Albert Decady
*Assistant Examiner*—Matthew C. Dooley
(74) *Attorney, Agent, or Firm*—Lance M. Kreisman

(57) ABSTRACT

A timing system is disclosed that responds to pattern generation circuitry for producing test patterns for application to a device-under-test. The timing system includes a timing memory circuit that stores programmed edge timings for the patterns and couples to timing logic including a master oscillator and a plurality of fixed edge generators. The fixed edge generators are responsive to the programmed edge timings to produce the event timing signals.

18 Claims, 5 Drawing Sheets

| EDGE SET | D0 | D1 | D2 | D3 | C1 | FMT |
|---|---|---|---|---|---|---|
| ES0 | 0.5ns | 1.3ns | 1.8ns | 0ns | 1.25ns | RL |
| ES1 | Off | 1.0ns | 2.0ns | 0ns | 1.25ns | RL |

LOW COST TIMING SYSTEM FOR HIGHLY ACCURATE MULTI-MODAL SEMICONDUCTOR TESTING

FIELD OF THE INVENTION

The invention relates generally to automatic test equipment for testing semiconductor devices, and more particularly a timing system and associated methods for use in a semiconductor device tester.

BACKGROUND OF THE INVENTION

Automatic test equipment serves a key manufacturing role in the fabrication of semiconductor devices. Commonly individually referred to as a "tester", the individual units verify the operability of each device at both the wafer (via probe testing) and packaged-device levels.

Commercially successful tester designs typically provide a semiconductor manufacturer with a combination of features specific to one or more particular applications. Desirable features usually involve a combination or trade-off of criteria such as cost, flexibility, accuracy, and ease of use. Generally speaking, the more features included in a tester, the higher the cost.

One of the critical tester sub-systems especially sensitive to the criteria noted above is the timing generation circuitry. A tester timing system generally establishes precise signal delays during a device-under-test (DUT) test cycle according to pre-programmed pattern data. The delays serve to mark the specific test events for the tester driver/comparator circuitry (such as drive to high, drive to low, strobe, etc.)

Conventional high-resolution timing systems utilize timing generators that employ coarse, medium and fine delay circuitry to produce timing resolutions (minimally selectable timing increments) on the order of picoseconds. The coarse delay circuitry includes, for example, a synchronous counter that produces an output based on integer multiples of the input clock.

To achieve medium and fine delays in conventional timing generators, interpolators are typically used. The medium delay is often realized by a plurality of delay elements that split the system clock signal into "medium" sliced time intervals. The fine delay is generally achieved by a delay circuit that usually includes a pair of analog inputs, one to receive a ramping voltage signal, and the other to receive the output from a digital-to-analog converter (DAC). The DAC converts a digital word representing a desired delay into a threshold voltage. When the ramping voltage reaches the threshold set by the DAC, the interpolator generates a signal offset by a fine fractional portion of the system clock.

One of the more desirable features of the analog interpolator involves the optional ability to change the delay value from the DAC "on-the-fly", from period to period. A highly flexible tester that employs interpolators having such "on the fly" capabilities for both period switching and timing switching is the model J973 tester manufactured by Teradyne, Inc., of Agoura Hills, Calif. This tester additionally includes an edgeset memory for storing pre-programmed timing values to control the timings for the various interpolators. While the circuitry and software required to effect on-the-fly changes generally substantially increases the cost of a tester, the capability provides a high level of flexibility in testing DUT's operating up to 250 MHz.

In an effort to minimize the cost associated with testing DUT's, while maintaining an acceptable level of flexibility, one proposal for a timing system employed "fixed" interpolators with no edgeset memory to provide a somewhat limited pallette of timing selections during DUT periods. The proposal, included in the Teradyne Model J921 Tester, manufactured by Teradyne Inc. of Agoura Hills, Calif., pre-set the interpolators such that the analog delay values could not change on the fly. The delay values were set according to user specifications to offer a selection of timing delays corresponding to the number of timing generators in the system. The system thus minimized costs by omitting the "on-the-fly" circuitry, and edgeset memory while offering a somewhat reduced level of timing flexibility.

While beneficial for its intended applications, the conventional fixed interpolator approach described above lacked the level of flexibility desired by some semiconductor manufacturers. The inflexibility resulted from the perceived lack of timing choices from the single set of fixed interpolators. While the selection could be increased by providing more interpolators, the additional hardware would offset any advantages inherent in omitting the "on-the-fly" circuitry.

More recently, as the operating speeds of semiconductor devices reach and surpass the gigahertz range, the desirability of costly "on-the-fly" circuitry and software has diminished. The reason involves the relatively few types of waveforms utilized at such speeds. With few waveforms to emulate, tester timing flexibility is not as critical.

Although tester timing flexibility isn't as critical for high-speed DUT's, many high speed semiconductor devices also implement relatively "slow-speed" ports (around 100 to 200 MHz). Thus, in order to completely test such devices, both high speed and slow speed patterns are required. Consequently, without the perceived testing advantages associated with highly flexible timing systems, many manufacturers are hesitant to invest in testers that omit the feature. The result is that manufacturers often purchase costly testers that provide more functionality than is actually required for a majority of the testing.

What is needed and heretofore unavailable is a fixed interpolator timing system that provides high speed, high resolution and low flexibility test capability with high accuracy. Moreover, such a system is needed that also provides low-speed, moderate resolution and high flexibility test capability at fairly high accuracies. Additionally, the need exists for such a system to be relatively low cost. The timing system and method of the present invention satisfies these needs.

SUMMARY OF THE INVENTION

The timing system of the present invention provides multi-modal semiconductor device test capabilities including a high-speed high accuracy mode and a low-speed high flexibility mode to test DUT pins requiring varying signal rates. Moreover, the timing system construction provides a straightforward user interface and low cost hardware architecture.

To realize the foregoing advantages, the invention in one form comprises a timing system that responds to pattern generation circuitry for producing test patterns for application to a device-under-test. The timing system includes a timing memory circuit that stores programmed edge timings for the patterns. The timing system further includes timing logic having a master oscillator and a plurality of fixed edge generators. The fixed edge generators are responsive to the programmed edge timings to produce the event timing signals.

In another form, the invention comprises a semiconductor tester for testing a device-under-test having a combination of high-speed and low-speed pins. The tester includes a test controller having a pattern memory and a user interface and a pattern generation circuit having respective high-speed and low-speed modes for selectively producing test patterns according to the pattern memory for application to the device-under-test according to a DUT clock period. A system bus connects to the test controller and the pattern generation circuit for routing command and data signals therebetween. The tester further includes drive/compare circuitry adapted for coupling to the device-under-test and a failure processing circuit disposed between the system bus and the drive/compare circuitry. A timing system generates event timing signals corresponding to predefined user settings. The timing system includes a timing memory circuit that stores programmed edge timings for the patterns. The timing system further includes timing logic including a master oscillator and a plurality of fixed edge generators. The fixed edge generators are configured to provide a fixed selection of timing signals corresponding to the fixed number of edge generators within a predetermined clock period.

In yet another form, the invention comprises a method of generating timing signals consistent with user-defined settings for a device-under-test having high-speed pins and low-speed pins. The timing system is responsive to a multi-mode pattern generation circuit and includes a timing memory and timing logic including a plurality of fixed edge generators. The method includes the steps of first assigning the fixed edge generators to produce a fixed number of edge timings corresponding to the edge generators within the DUT period in the high-speed mode; applying high-speed patterns to the DUT high-speed pins in accordance with the operating DUT period; allocating the fixed-edge generators to produce a selection of edge timings in multiples of a master oscillator period within the DUT period; and driving low-speed patterns to the DUT low-speed pins in accordance with edge timings from the selection of edge timings closest to the user-defined settings.

A further form of the invention comprises a method of generating timing signals for a window strobe event. The method includes the steps of first providing a plurality of timing generators generators having fixed timing delays defining a range of timing values; generating a plurality of edge strobe signals with the timing generators; and selecting a sub-set of edge strobe signals within the plurality of edge strobe signals to approximate the specified window strobe edges.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

As semiconductor devices become ever more complex, the sophisticated systems required to test the devices must keep pace or become quickly obsolete. The ability to test state-of-the-art semiconductor devices while minimizing the test system cost presents a significant and important challenge to the automatic test equipment industry.

Figure 1:
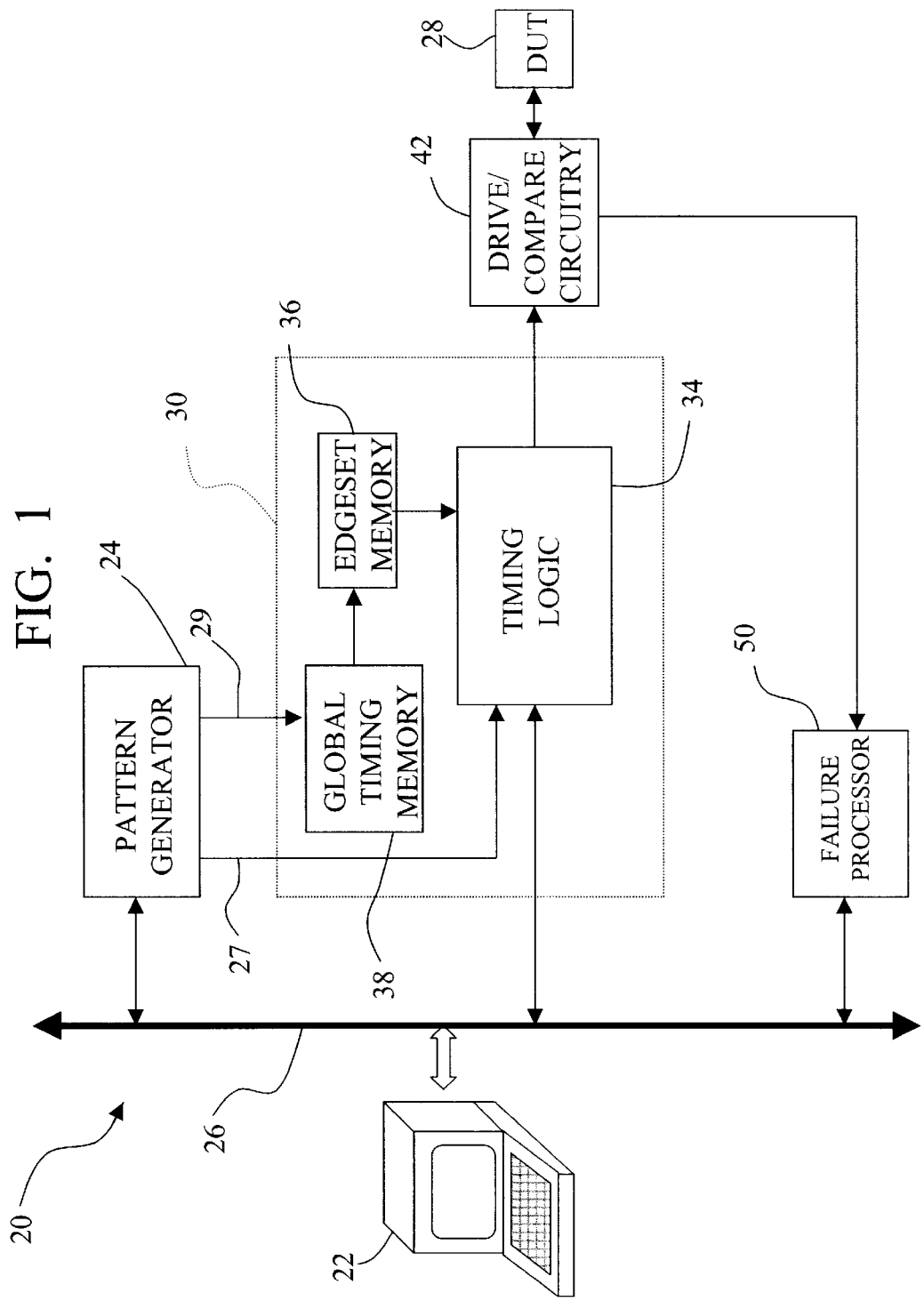
FIG. 1 is a generalized block diagram of a tester employing the timing system of the present invention.

Referring now to FIG. 1, an abbreviated block diagram of a high-accuracy and low cost semiconductor tester, generally designated 20, includes a computer workstation 22 operating as a test controller. The test controller couples to a system bus 26 for distributing control signals between the test controller and a pattern generation circuit 24, a timing system 30, and a failure processing circuit 50. The pattern generation circuit preferably includes from one to N pattern generators (only one shown in FIG. 1 for clarity) to generate a plurality of tester operating modes. The modes generally correspond to relatively high-speed (>250 MHz) and relatively slow-speed (<250 MHz) test patterns. A pin data line 27 and a global timeset address line 29 couple the pattern generator to the timing system while pattern information to and from the failure processor is distributed via the system bus 26.

In accordance with the present invention, the timing system 30 includes low-cost timing logic 34 responsive to an edgeset memory 36 for producing the programmed timing signals necessary to fire per-pin drive/compare circuitry 42 at predetermined timings (defining a tester waveform) with respect to a period of operation for a device-under-test (DUT) 28. An optional global timing memory circuit or timeset memory 38 couples to the pattern generation circuit 24 via the global timeset address line 29 and feeds pre-programmed local timing data to the edgeset memory 36 to enable a reduction in the memory capacity thereof.

Figure 2:
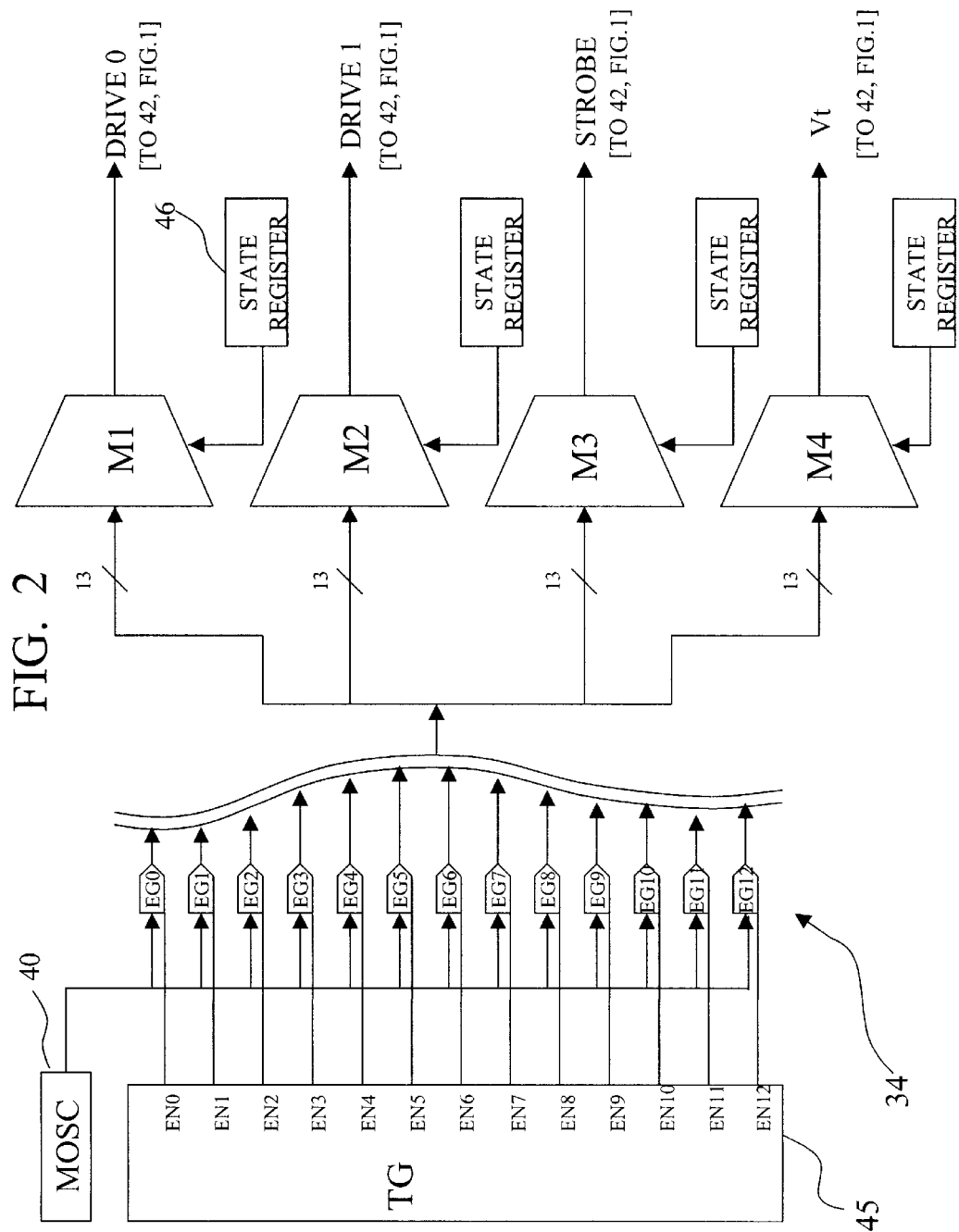
FIG. 2 is a partial block diagram of the timing system shown in FIG. 1.

Referring more particularly to FIG. 2, the timing logic 34 according to one embodiment of the present invention, supports multi-modal testing of high and low-speed DUT pins by selectively providing timing values for assignment to desired user timings. The timing logic preferably includes a programmable PLL-based master oscillator MOSC 40 and a timing generator 45 that provides respective enable inputs to a plurality of edge generators in the form of respective interpolators EG0–EG12. It should be understood that the configuration of thirteen edge generators is described herein as exemplary only, and that many configurations are possible without departing from the spirit of the invention.

Associated with each edge generator is a corresponding delay element (not shown) and an enable input supplied by the timing generator 45.

The master oscillator MOSC is capable of clock rates up to 2 gigahertz, corresponding to periods of 500 picoseconds and fully programmable as test needs require. The programmability of the PLL implementation advantageously allows users to define tester clock periods that synchronize with the DUT periods, thereby substantially eliminating the need for somewhat costly and complex "on the fly" interpolators.

Further referring to FIG. 2, in an effort to minimize expensive "on-the-fly" circuitry and maximize timing accuracy, the edge generators EG0–EG12 are "fixed" in the sense that the analog delay value is incapable of being changed from DUT period-to-period. The edge generator outputs are fed to a selector circuit that includes respective networks of AND and OR gates (not shown) that collectively define an array of four multiplexers M1–M4. More specifically, the edge generator outputs are directed in a parallel relationship to the inputs of each multiplexer. The multiplexers respond to respective static registers 46 that are programmed at set-up time to, during operation, selectively pass timing signals to the drive/compare circuitry 42. The timing signals correspond to actions "Drive to logic 0 (D0), "Drive to logic 1" (D1), strobe (C1) and "Drive to termination" (Vt).

In operation, the edge generators EG0–EG12 may be configured to maximize timing resolution and flexibility depending on the expected modes of operation. Control of the edge generators is carried out by pre-programming the test controller 22 and the edgeset memory 36 to fire predetermined edge generators at the specific increments of time following the beginning of the DUT cycle (BOC). For high-speed ports, the edge generator resources are allocated by the user to fire at specific timings designated by the user at very high accuracies.

Figures 3, 4:
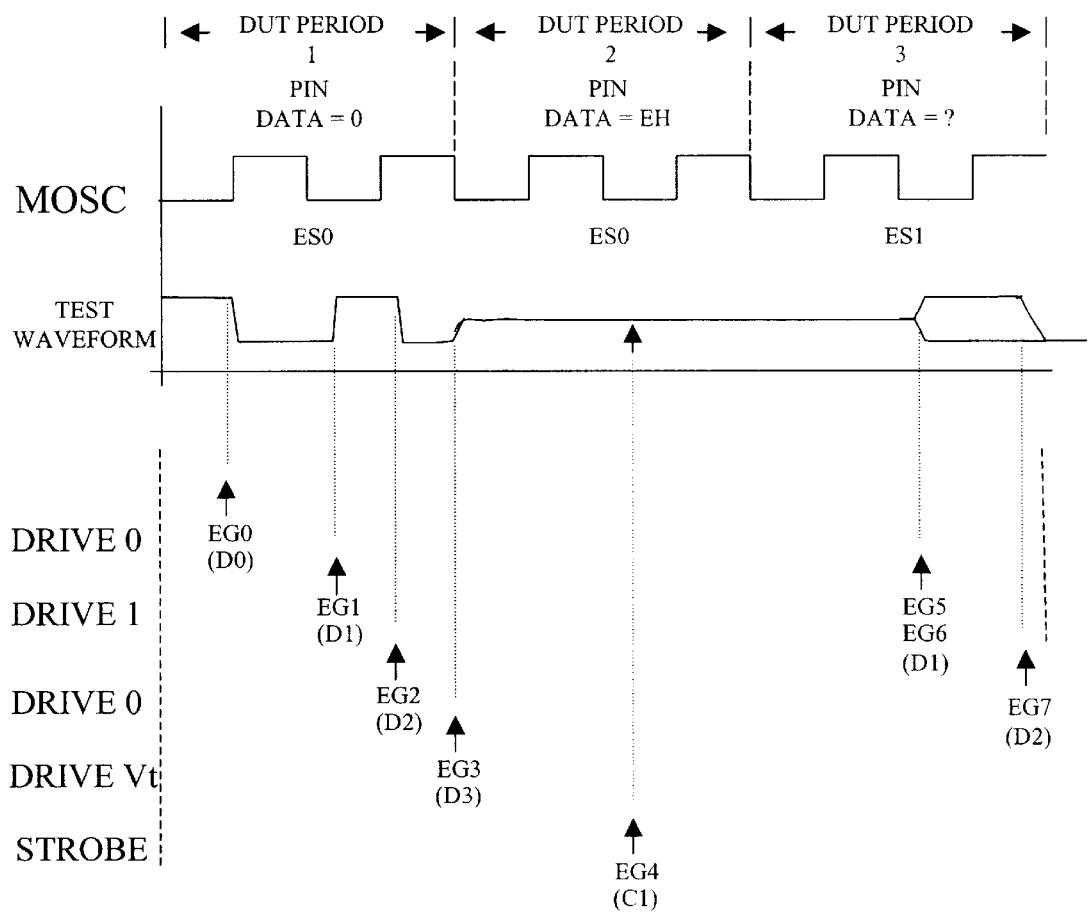
FIG. 3 is an example of a high-speed test waveform defined by timing signals according to one form of the present invention.
FIG. 4 is an example of an edgeset memory table for storing the timings that correspond to the test waveform of FIG. 3.

FIG. 3 illustrates a high-speed test waveform suitable for application to a high-speed DUT pin as defined by timing signals generated by the timing system of the present invention. Each transition (or "edge") of the test waveform corresponds to the output of a driver (not shown) responding to one or more timing signals issued by one or more of the edge generators EG0–EG12. At relatively high frequencies in the gigahertz range, few waveforms are required to verify the operability of a DUT. Consequently, the number of edge generators can be minimized to reduce system hardware costs.

Referring now to FIG. 4, a partial example of an edgeset memory 36 corresponding to the test waveform of FIG. 3 comprises a table for inserting desired timing values for the timing generators to define the waveform transitions, or edges corresponding to the above events (D0, D1, strobe, Vt). A similar edgeset table is utilized for relatively low-speed semiconductor devices (up to 250 MHz) in the Teradyne Model J973 tester, manufactured by Teradyne Inc., Agoura Hills, Calif. Each row represents an "edgeset", which assigns predetermined timings with respect to the beginning of the DUT cycle. The individual columns represent transition edges or events (D0, D1, D2, D3, C1, etc.) and the waveform format (fmt). For each event on each edgeset, the test controller software assigns an edge generator within the predetermined sub-group (Drive 0, Drive 1, Drive Vt, and Strobe) and programs it to the user-specified value. This results in a driver or comparator in the driver/comparator circuitry 42 activating, thereby generating the waveform edge. Calibration techniques well known to those skilled in the art may be applied to provide maximum timing accuracy. FIG. 3 also illustrates the individual edge generator firings pursuant to the edgeset memory table in FIG. 4 to effect the desired waveform shown in FIG. 3.

Further referring to FIGS. 3 and 4, a user desiring to employ the edge sets ES0 and ES1 (FIG. 4) to generate the test waveform of FIG. 3 can first expect a "Drive 0" or "Drive-Low" event to occur 0.5 ns following the beginning of the first DUT cycle, or drive cycle. At the programmed time, a predetermined edge generator (here, EG0) fires to activate the tester channel driver to drive to a low level. At 1.3 ns, a "Drive 1" or "Drive High" event occurs by the firing of a second edge generator (here, EG1) if the pin data from the pattern generator is high (a logical 1). Otherwise the level will remain low.

If the pin data from the pattern generator indicates a compare cycle, the edgeset information further specifies a "Drive Vt" event occurring coincident with the beginning of the second DUT cycle (0.00 ns), or compare cycle, to cause the driver to drive the tester channel output to the termination voltage Vt. To complete the edgeset, at 1.25 ns (after the second DUT cycle) a strobe event occurs with the firing of edge generator EG4, causing the channel comparator (not shown) to detect the DUT pin data level.

The rest of the test waveform is defined by the second edge set ES1 (FIG. 4) in a manner similar to that described above for the first edge set ES0.

It can readily be seen that the first edge set ES0 consumes five edges to carry out the described portion of the test waveform in FIG. 3. The inventor has determined that to provide sufficient edge resources to cover a wide range of waveform possibilities (through the careful use of edge sets), and simultaneously minimize hardware costs, configurations of anywhere from between four to fifteen edge generators are adequate.

Figures 5, 6:
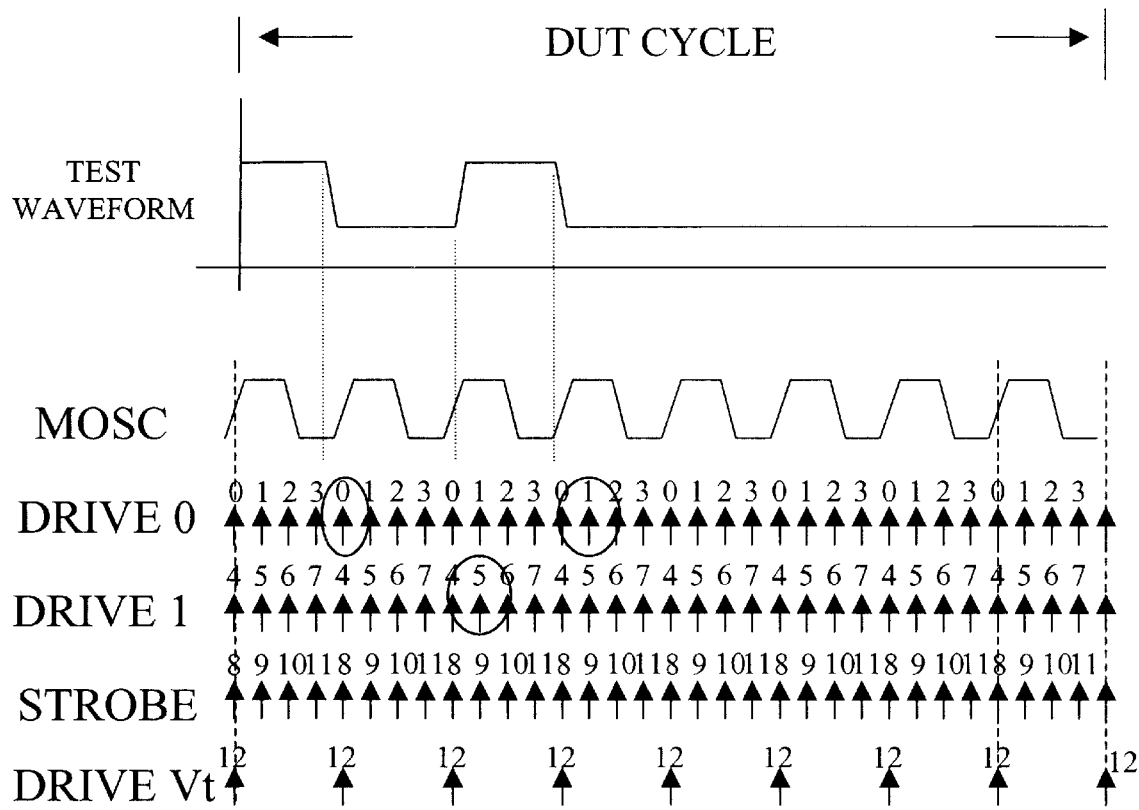
FIG. 5 is an example of a low-speed test waveform defined by timing signals according to one form of the present invention.
FIG. 6 is an example of an edgeset memory table for storing the timings that correspond to the test waveform of FIG. 5.

In addition to providing the capability of testing high speed DUT ports, one of the more important features of the fixed-interpolator timing system of the present invention is its ability to provide high flexibility timing for slow-speed DUT ports. The inventor has discovered a way of maintaining the low-cost and highly accurate timing system of the present invention while providing a dramatic improvement in the timing flexibility for such slow-speed DUT pins. As shown in FIG. 5, this is accomplished by programming sets of edge generators in fixed incremental relationships with respect to the master oscillator MOSC period, and substantially dividing the DUT period up by the MOSC period. In this way, the DUT period is effectively sliced into fine "ticks" or timing values. For a DUT period of 4 nanoseconds (corresponding to a DUT frequency of 250 MHz), and a master oscillator MOSC period of 500 picoseconds, a total of thirty-two timing selections would be available for a particular event (such as "Drive 0) at relatively small increments within the DUT period.

Moreover, the inventor has determined that to carry out this aspect of the present invention, the master oscillator period need not be less than 563 ps. This translates into a worst-case resolution (for an implementation that utilizes thirteen edge generators as shown in FIG. 5) of approximately 141 picoseconds.

For example, to test the low speed ports of a DUT as indicated above, the edge generators EG0–EG12 are preferably evenly distributed (with respect to pre-programmed time delays) into sub-sets corresponding to the specific waveform events, such as the previously described events "Drive 0", "Drive 1", "strobe", and "Drive Vt" (Ref. FIG. 5). Utilizing respective sub-sets of pre-assigned spaced-apart edge generators within each master oscillator period for Drive 0 (EG0–EG3), Drive 1 (EG4–EG7), and Strobe (EG8–EG11), and the remaining edge generator EG12 for Drive Vt, the high speed resolution for timing values (at a master oscillator period of 500 picoseconds) comes out to 125 picoseconds.

FIG. 5 further illustrates a portion of a multi-period waveform for application to a slow-speed DUT pin of around 200 MHz according to the edge set assignments shown in FIG. 6. In a manner similar to the high speed example described previously, events for defining the test waveform are specified by the edgeset memory 36. Consequently, the first event (Drive 0) for edgeset ES0 fires at 0.5 ns following the beginning of the first DUT cycle. However, unlike the high speed example previously described, the available edge generators for Drive 0 are pre-programmed as EG0–EG3, with possible timings fixed at regular intervals of 125 ps within the master oscillator MOSC period. The test controller 22 automatically assigns the edge generator closest to the user-programmed timing (in this case for Drive 0, EG0) to fire while maintaining an acceptable level of accuracy. Each assignment is stored in the edgeset memory as the edge generator number and the number of master oscillator cycles. Likewise, for the Drive 1 event timing in ES0, the closest edge generator is EG5 (shown circled in FIG. 5).

Another important feature of the present invention is its application to approximating a window strobe. "Window strobing" is a feature where the output of the DUT is observed by one or more level comparator(s) between two user-specified points in time, and any level transition is noted. It is useful for detecting glitches on DUT outputs, or making sure a DUT output stays constant for the duration of the specified time window.

Figure 7:
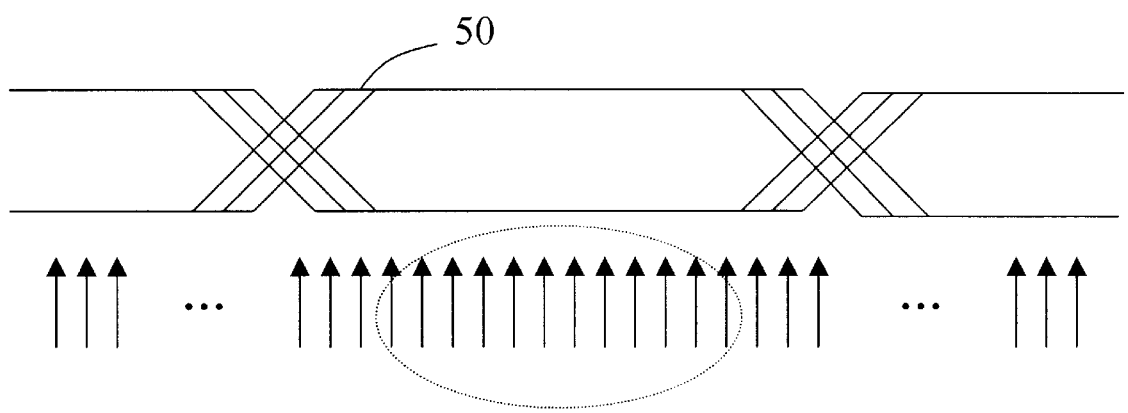
FIG. 7 is a timing architecture diagram illustrating a window strobe approximation feature of the present invention.

In general, a high speed, high accuracy tester would not want to implement a window strobe because of an inherently reduced level of performance as compared to an edge strobe. However, for a low speed mode in a high-speed tester, a window strobe is highly desirable. In this invention, a window strobe may be approximated by providing a series of edge strobes in rapid succession as shown in FIG. 7. To generate a window strobe, the edge set memory 36 is modified to contain two strobe values, C1 and C2, and the user assigns C1 to specify the "open window" time and C2 to specify the "close window" time. The channel is strobed by all the strobe events between the C1 and the C2 time. Since a strobe event occurs every 563/4=141 ps worst case (for a 13 edge implementation), the tester can check the DUT output every 141 ps. Given the high performance of the edge strobe comparator in a high-speed system, the performance of this window strobe mode compares favorably with the true window mode of a tester in the 200 MHz range.

Those skilled in the art will appreciate the many benefits and advantages afforded by the present invention. Of significant importance is the ability to test a DUT having both high-speed and low-speed pins with a timing system utilizing fixed edge generators. The fixed nature of the edge generators minimizes the hardware and software necessary to carry out DUT testing, realizing significant cost savings to semiconductor manufacturers without compromising high accuracy and relatively high resolution capabilities. Moreover, the relatively straightforward programming required to control the edge generator timings maximizes the user-friendly nature of the system.

An additional feature of the present invention involves compatibility with conventional tester constructions. Many of the user programming features for controlling edge generator timings at low-speeds, such as the edgeset memory table, are conventional in nature. Thus, user familiarity is maximized, resulting in minimal additional training to properly educate manufacturing personnel.

While the invention has been particularly shown and described with reference to the preferred embodiments thereof, it will be understood by those skilled in the art that various changes in form and detail may be made therein without departing from the spirit and scope of the invention. For example, while the specific embodiment of the timing logic shown and described herein comprises thirteen interpolators, different numbers of edge generators may be implemented with varying results, depending on the available cost and hardware constraints of the specific applications addressed.

What is claimed is:

1. A semiconductor tester for testing a device-under-test having a combination of high-speed and low-speed pins, said tester including:
   a test controller having a pattern memory and a user interface;
   a pattern generation circuit having respective high-speed and low-speed modes for selectively producing test patterns according to said pattern memory for application to said device-under-test, said device-under-test operating according to a DUT clock period;
   a system bus connected to said test controller and said pattern generation circuit for routing command and data signals therebetween;
   drive/compare circuitry adapted for coupling to said device-under-test;
   a failure processing circuit disposed between said system bus and said drive/compare circuitry; and
   a timing system to generate event timing signals corresponding to predefined user settings, said timing system including:
      a timing memory circuit for storing programmed edge timings for said patterns; and
      timing logic including a master oscillator and a plurality of fixed edge generators, said fixed edge generators responsive to said programmed edge timings to produce said event timing signals.

2. A semiconductor tester according to claim 1 wherein: said edge generators are adapted for user-controlled timing placement for high speed DUT ports.

3. A semiconductor tester according to claim 1 wherein: said edge generator timings are pre-set in evenly distributed timing increments with respect to said master oscillator for low speed DUT ports.

4. A semiconductor tester according to claim 3 wherein: said edge generator timings are grouped into respective sub-sets of timing selections within a DUT period and corresponding to predefined tester events.

5. A semiconductor tester according to claim 4 wherein: said logic is responsive to said programmed edge timings to assign a programmed edge timing to the closest corresponding fixed timing within said sets of timing selections.

6. A semiconductor tester according to claim 1 wherein said pattern generation circuit includes:
   a first pattern generator for producing patterns in said high-speed mode.

7. A semiconductor tester according to claim 6 wherein said high-speed mode ranges from approximately 250 megahertz to 2.0 gigahertz.

8. A semiconductor tester according to claim 1 wherein said pattern generation circuit includes:
   a second pattern generator for producing patterns in said low-speed mode.

9. A semiconductor tester according to claim 7 wherein said low-speed mode ranges from between around 1 megahertz to approximately 250 megahertz.

10. A semiconductor tester according to claim 1 wherein: said patterns comprise vector data associated with individual cycles of a device-under-test, said vector data including predefined event signals for application to or comparison from said device-under-test.

11. A semiconductor tester according to claim 1 wherein said timing memory includes:

a per-pin timeset memory.

12. A semiconductor tester according to claim 11 wherein said timeset memory is configured to provide local timing data to said timing system.

13. A semiconductor tester according to claim 1 wherein said timing memory includes:

a per-pin edgeset memory.

14. A semiconductor tester according to claim 13 wherein said edgeset memory is configured to define per-pin timing values for predetermined waveform events within a DUT period.

15. A semiconductor tester according to claim 1 wherein said fixed edge generators comprise respective interpolators.

16. A semiconductor tester according to claim 1 wherein said master oscillator includes a programmable frequency phase-locked-loop.

17. A method of generating timing signals consistent with user-defined settings for a device-under-test, said DUT having high-speed pins and low-speed pins, said timing signals generated by a timing system responsive to a multi-mode pattern generation circuit and including a timing memory and timing logic including a plurality of fixed edge generators, said method including the steps of:

assigning said fixed edge generators to produce a fixed number of edge timings corresponding to said edge generators within said DUT period in said high-speed mode;

applying high-speed patterns to said DUT high-speed pins in accordance with said operating DUT period;

distributing said fixed-edge generators to produce a selection of edge timings per master oscillator period.

18. A method of generating timing signals according to claim 17 and further including the step of:

driving low-speed patterns to said DUT low-speed pins in accordance with edge timings from said selection of edge timings closest to said user-defined settings.

* * * * *